US011018327B2

(12) United States Patent
Wang et al.

(10) Patent No.: US 11,018,327 B2
(45) Date of Patent: May 25, 2021

(54) MASK MODULE, METHOD FOR MANUFACTURING A FILM LAYER, ORGANIC ELECTROMAGNETIC LIGHT-EMITTING DISPLAY PANEL AND METHOD FOR MANUFACTURING THE SAME

(71) Applicants: BOE TECHNOLOGY GROUP CO., LTD., Beijing (CN); Chengdu BOE Optoelectronics Technology Co., Ltd., Sichuan (CN)

(72) Inventors: Li Wang, Beijing (CN); Ling Shi, Beijing (CN)

(73) Assignees: BOE Technology Group Co., Ltd., Beijing (CN); Chengdu BOE Optoelectronics Technology Co., Ltd., Shichuan (CN)

( * ) Notice: Subject to any disclaimer, the term of this patent is extended or adjusted under 35 U.S.C. 154(b) by 399 days.

(21) Appl. No.: 16/076,286

(22) PCT Filed: Jan. 9, 2018

(86) PCT No.: PCT/CN2018/071944
§ 371 (c)(1),
(2) Date: Aug. 7, 2018

(87) PCT Pub. No.: WO2018/227958
PCT Pub. Date: Dec. 20, 2018

(65) Prior Publication Data
US 2021/0020871 A1 Jan. 21, 2021

(30) Foreign Application Priority Data
Jun. 16, 2017 (CN) .......................... 201710459217.2

(51) Int. Cl.
*C23C 14/24* (2006.01)
*H01L 51/00* (2006.01)
(Continued)

(52) U.S. Cl.
CPC ............ *H01L 51/56* (2013.01); *C23C 14/042* (2013.01); *C23C 14/24* (2013.01);
(Continued)

(58) Field of Classification Search
CPC . H01L 51/0011; H01L 51/5253; H01L 51/56; H01L 51/5203; H01L 51/0002;
(Continued)

(56) References Cited

U.S. PATENT DOCUMENTS 6,828,582 B1 * 12/2004 Ando ..................... B82Y 10/00
257/350
2004/0099863 A1 * 5/2004 Chen ................... H01L 27/1288
257/66
(Continued)

FOREIGN PATENT DOCUMENTS

CN 103225059 A 7/2013
CN 103898441 A 7/2014
(Continued)

OTHER PUBLICATIONS

International Search Report and Written Opinion dated Feb. 26, 2018, for application No. PCT/CN2018/071944.

*Primary Examiner* — Caridad Everhart
(74) *Attorney, Agent, or Firm* — Arch & Lake LLP (57) ABSTRACT

This disclosure provides a mask module, a method for manufacturing a film layer, and a method for manufacturing an organic electromagnetic light-emitting display panel. The mask module is configured to manufacture a display substrate. The display substrate has at least one display area. The display area has at least one island pattern. The mask
(Continued)

module includes at least two open type masks. Each of the open type masks has an opening area corresponding to at least one of the display areas. The opening areas of the open type masks corresponding to the same display area are not overlapped with each other, and the open type masks are stitched to constitute a joint and a blocking structure. The joint has a shape as same as that of the display area, and the blocking structure has a shape as same as that of the island pattern.

13 Claims, 5 Drawing Sheets

(51) Int. Cl.
*H01L 51/52* (2006.01)
*H01L 27/32* (2006.01)
*H01L 51/56* (2006.01)
*C23C 14/04* (2006.01)

(52) U.S. Cl.
CPC ....... *H01L 51/0011* (2013.01); *H01L 51/5221* (2013.01); *H01L 51/5253* (2013.01)

(58) Field of Classification Search
CPC ............. H01L 51/0021; H01L 27/3244; H01L 51/5221; H01L 27/32; C23C 14/042; C23C 14/24
See application file for complete search history.

(56) References Cited

U.S. PATENT DOCUMENTS

| | | | |
|---|---|---|---|
| 2006/0043510 A1* | 3/2006 | Yamazaki | H01L 27/3244 257/432 |
| 2010/0221919 A1* | 9/2010 | Lee | H01L 27/11526 438/694 |
| 2013/0192521 A1 | 8/2013 | Chu et al. | |

FOREIGN PATENT DOCUMENTS

| | | | |
|---|---|---|---|
| CN | 104157550 A | 11/2014 | |
| CN | 104157550 B | 8/2016 | |
| CN | 107236927 A | 10/2017 | |
| JP | 2005327740 A | * 11/2005 | ............ H05B 33/14 |
| TW | 201331393 A | 8/2013 | |

* cited by examiner

MASK MODULE, METHOD FOR MANUFACTURING A FILM LAYER, ORGANIC ELECTROMAGNETIC LIGHT-EMITTING DISPLAY PANEL AND METHOD FOR MANUFACTURING THE SAME

CROSS REFERENCE

This application is based upon International Application No. PCT/CN2018/071944, filed on Jan. 9, 2018, which claims priority to Chinese Patent Application No. 201710459217.2, filed on Jun. 16, 2017, the entire contents thereof are incorporated herein by reference.

TECHNICAL FIELD

The present disclosure relates to a display technical field, and particularly to a mask module, a method for manufacturing a film layer, an organic electroluminescent display panel, and a method for manufacturing the electroluminescent display panel.

BACKGROUND

Generally, a display area (AA) of the conventional organic electroluminescent display panel (OLED) screen is a regular pattern such as a rectangle. In order to meet special needs, the display area of the OLED screen is also required to have a special irregular pattern, such as, for displaying a specific logo, for example, a screen without a frame needs a irregular display area in which a camera and an earpiece may be placed.

SUMMARY

An arrangement of the present disclosure provides a mask module for manufacturing a display substrate. The display substrate has at least one display area. The display area has at least one island pattern. The mask module includes at least two open type masks, each of the open type masks has an opening area corresponding to at least one of the display areas. The opening areas of the open type masks corresponding to the same display area are not overlapped with each other. The open type masks are stitched to constitute a joint and a blocking structure. The joint has a shape as same as a shape of the display area, and the blocking structure has a shape as same as a shape of the island pattern.

In one implementation, in aforesaid mask module according to the arrangement of the present disclosure, the opening areas of the open type masks corresponding to the same display area constitute a complementary pattern.

In one implementation, in aforesaid mask module according to the arrangement of the present disclosure, a stitching edge between opening areas of the open type masks corresponding to the same display area corresponds to a gap between pixel light-emitting areas in the display area.

In one implementation, in aforesaid mask module according to the arrangement of the present disclosure, a stitching edge between opening areas of the open type masks corresponding to the same display area is a curve or a polyline.

In one implementation, in aforesaid mask module according to the arrangement of the present disclosure, a stitching edge between opening areas of the open type masks corresponding to the same display area have a grating complementary structure.

In one implementation, in aforesaid mask module according to the arrangement of the present disclosure, a stitching edge between opening areas of the open type masks corresponding to the same display area has a strip structure, and the strip structure between the two stitching edges constitutes a finger-cross structure.

In one implementation, in aforesaid mask module according to the arrangement of the present disclosure, a stitching edge between opening areas of the open type masks corresponding to the same display area has a semi-evaporation structure.

In one implementation, in aforesaid mask module according to the arrangement of the present disclosure, a thickness of the mask at a stitching edge area between opening areas of the open type masks corresponding to the same display area is smaller than a thickness at other areas, and the thickness at one side of the stitching edge area facing to the display panel to be evaporated is decreased.

In one implementation, in aforesaid mask module according to the arrangement of the present disclosure, a ratio of the thickness decreased at the stitching edge area is 20%-50%.

In one implementation, in aforesaid mask module according to the arrangement of the present disclosure, number of open type masks is two.

An arrangement of the present disclosure provides a method for manufacturing a film layer includes using the open type masks in the mask module according to any one of claims 1 to 10 as a blocking pattern sequentially to perform evaporation of the same materials to the same motherboard, such that an evaporation film layer having an island pattern is formed at the display area of the motherboard corresponding to each display substrate.

In one implementation, in aforesaid manufacturing method according to the arrangement of the present disclosure, the evaporation film layer is an organic light-emitting functional film layer, a cathode layer, or a thin film encapsulation functional layer.

An arrangement of the present disclosure provides a method of manufacturing an organic electroluminescent display panel, including the method of manufacturing the film layer according to the arrangements of the present disclosure.

An arrangement of the present disclosure provides an organic electroluminescent display panel manufactured by the above-described manufacturing method, including forming a film layer in a display area, each film layer having a cutout area overlapped with each other to form an island pattern in the display area.

In one implementation, in aforesaid organic electromagnetic light-emitting display panel according to the arrangement of the present disclosure, a camera or an earpiece is disposed at the island pattern; or the island pattern is a set identification image.

DETAILED DESCRIPTION

Now, the exemplary arrangements will be described more fully with reference to the accompany drawings. However, the exemplary arrangements may be implemented in various forms and should not be construed as limited to the arrangements set forth herein. Instead, these arrangements are provided so that the present disclosure will be thorough and complete, and the concept of the exemplary arrangement will fully conveyed to those skilled in the art. Same reference signs denote the same or similar structures in the accompany drawings, and thus the detailed description thereof will be omitted.

The relativity words, such as "upper" or "lower", as used herein, are directed to describe the relative relationship of the referenced component to another component. These words are used herein for convenience only, for example, according to the direction of the illustrative examples as shown in the figures. It should be appreciated that if the referenced device is inversed upside down, the component indicated as being the "upper" side would become the component on the "lower" side. When one structure is "on" another structure, it is possible to indicate that the one structure is integrally formed on the other structure, or the one structure is "directly" arranged on the other structure, or one structure is "indirectly" formed on the other structure by means of a further structure.

The terms "a", "an", "the", "said" and "at least one", when describing element/constituent/ or the like as described and/or shown herein, are used to express the presence of one or more the element/ constitute/ or the like. The terms "include", "comprise" and "have", as used herein, are intended to be inclusive, and mean there may be additional elements/constituents/ or the like other than the listed elements/constituents/or the like. In addition, the words "first", "second", or the like, as used in claims, are meant to indication, but not to limit the object to which they modify.

Figure 1:
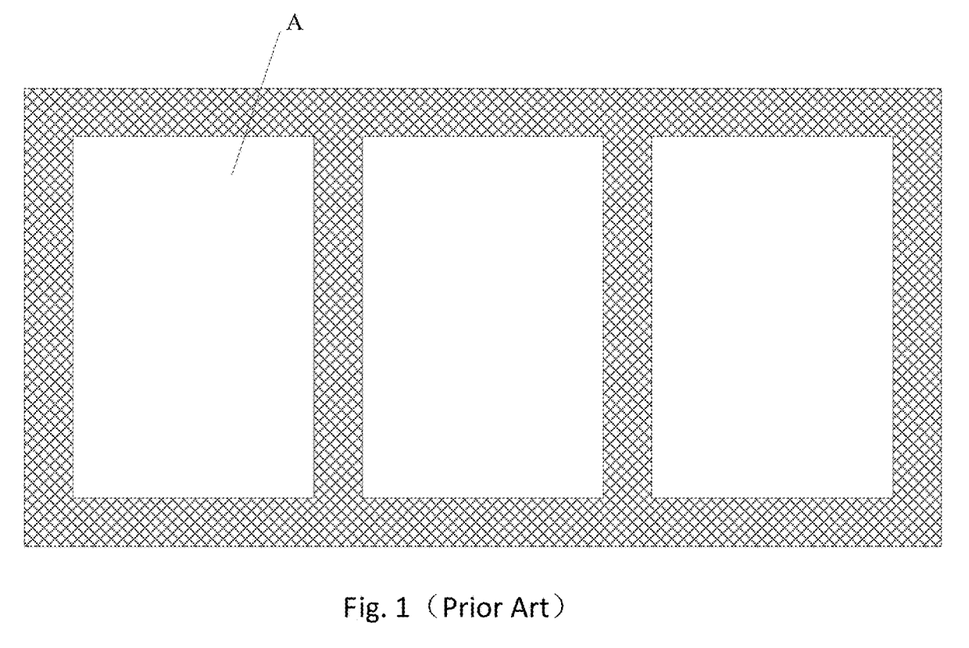
FIG. 1 and FIG. 2 are schematic structural views of a mask in the prior art.
Figure 2:
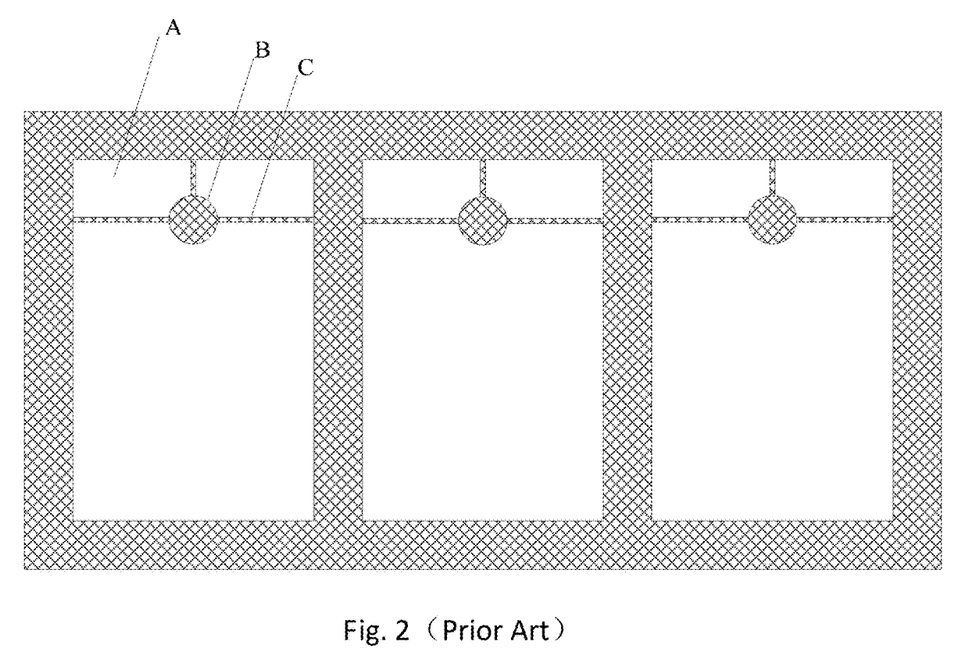

In general, in the OLED manufacturing process, an evaporation of the organic material of a light-emitting functional layer (EL) is performed by using an open type mask (Open Mask), i.e., a mask with a window. As shown in FIG. 1, the open type mask is provided with an opening A, i.e., a cutout area at a position corresponding to a display area of each display substrate. The opening A is not blocked by a metal, for evaporating the organic materials. When the display area needs to make an island pattern, as shown in FIG. 2, the open type mask needs to be provided with a metal blocking pattern B that correspondingly blocks the island pattern in the opening A, so that a connecting structure C for connecting the metal blocking pattern B to an edge of the opening A will be provided. The connecting structure C may block a part of the display area, so that the conventional open type mask may not be employed for manufacture of the irregular pattern display.

Hereinafter, the specific implementations of the mask module, the organic electroluminescent display panel and a method for manufacturing the same according to the arrangement of the present disclosure in combination with drawings.

The shapes and sizes of the areas in the drawings are not used to reflect the true scale of the mask module but only for the purpose of schematically illustrating the present disclosure.

Figure 3:
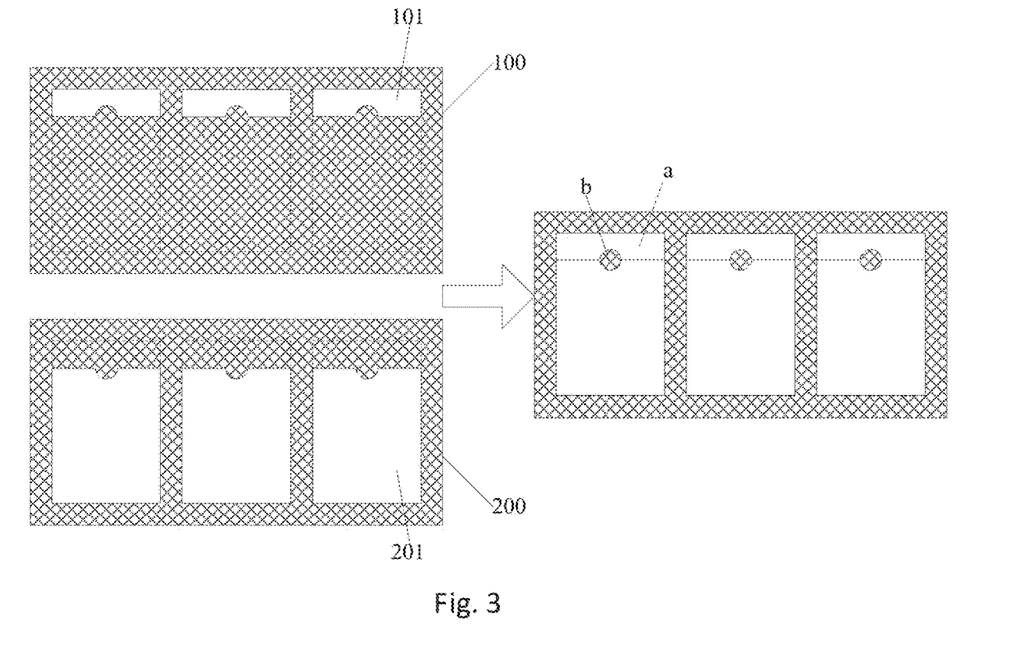
FIG. 3 is a schematic structural view of a mask module according to an arrangement of the present disclosure.

An arrangement of the present disclosure provides a mask module, as shown in FIG. 3, including at least two open type masks 100 and 200. Each of the open type masks 100 and 200 has an opening area 101 and 201 corresponding to a display area of at least one display substrate, respectively. After the open type masks 100 and 200 are stitched together, the opening areas 101 and 201 are not overlapped with each other, to form a joint a that has the same shape as the display area and a blocking structure b that has the same shape as the island pattern.

Particularly, in the foresaid mask module according to the arrangement of the present disclosure, a mask module consisting of a plurality of open type masks 100 and 200 are substituted for one existing open type mask to manufacture a film layer having an island pattern in the display area. The opening areas 101 and 201 of each open type mask 100 and 200 are not overlapped with each other and the opening areas 101 and 201 are stitched to form a pattern of the display area having the island pattern. This may ensure that the connecting structure connecting to the blocking pattern is not contained within the opening areas 101 and 201 of the open type masks 100 and 200. In this way, the above-described open type masks 100 and 200 are successively used as the blocking patterns to perform evaporation of the same materials to the same motherboard, such that an evaporation film layer having an island pattern may be formed at the display area of the motherboard corresponding to each display substrate, and thus the pattern of the manufactured blocking film layer may not affected by the connecting structure, and thus an organic light-emitting display panel including at least one island pattern may be made according to requirements.

It should be noted that the organic light-emitting display panel does not have a film layer pattern at the island pattern, that is, no display at the island pattern. It is possible to provide a camera or an earpiece, and make the island pattern to be a specific logo so as to realize the irregular display.

Particularly, the mask module in FIG. 3 according to the arrangement of the present disclosure is formed by two open type masks 100 and 200, and each of the open type masks 100 and 200 is used to make three display substrates, i.e., having three opening areas, for example. FIG. 3 only shows there is only one blocking structure b in the joint a. In a specific implementation, the size of the mask module may be set according to actual needs to produce different numbers of display substrates, and a plurality of the blocking structures b may be arranged in the joint a as required, and the shape of the blocking structure b is not limited. In addition, a mask module consisting of a plurality of open type masks 100 and 200 may be provided according to the actual requirements without being limited to the number and shape of the blocking structure b. However, if many more open type masks 100 and 200 forming the mask module are selected, it is disadvantageous to reduce production cost and production efficiency. Therefore, preferably, in the aforementioned mask module according to the arrangement of the present disclosure, two open type masks 100 and 200 are preferably used to meet the requirement of creating a joint a having a plurality of blocking structures b. Therefore, the mask module consisting of two open type masks 100 and 200 as shown in FIG. 3 is taken for an example.

In a specific implementation, in the aforementioned mask module according to the arrangement of the present disclosure, as shown in FIG. 3, in order to ensure that the opening areas 101 and 201 of each of the open type masks 100 and 200 are a complete cutout pattern, i.e., a joint, there is not any blocking structure be contained in the interior, it is required to cut the joint a along the edge of the blocking structure b, and the opening areas 101 and 201 of each of the open type masks 100 and 200 block a part of the blocking structure b, such that the opening areas 101 and 201 of each of the open types masks 100 and 200 corresponding to the same joint a may form a complementary pattern.

In a specific implementation, when the film layer pattern is manufactured by using the mask module according to the arrangement of the present disclosure, the above-described open type masks 100 and 200 are sequentially used as the blocking patterns, to perform evaporation of the same mother board with the same materials, so as to from the evaporation film layer having the blocking structure b at the joint a in the mother board corresponding to each display substrate, such that the produced pattern of the blocking film layer is not affected by the connecting structure. However, several evaporations of the materials may be performed at an stitching edge d between the opening areas 101 and 201 of each of the open type masks 100 and 200 corresponding to the same joint a, it is easy to occur a problem that display is affected due to non-uniform film layer at the stitching edge d caused by alignment accuracy and manufacturing accuracy of the respective open type masks 100 and 200.

Based on this, in the specific implementation, in the aforementioned mask module according to the arrangement of the present disclosure, three methods below may be used to improve the above problem. These three methods may be used at the same time or alternatively, which is not limited herein. The detailed description of these three methods will be provided.

Figure 4A:
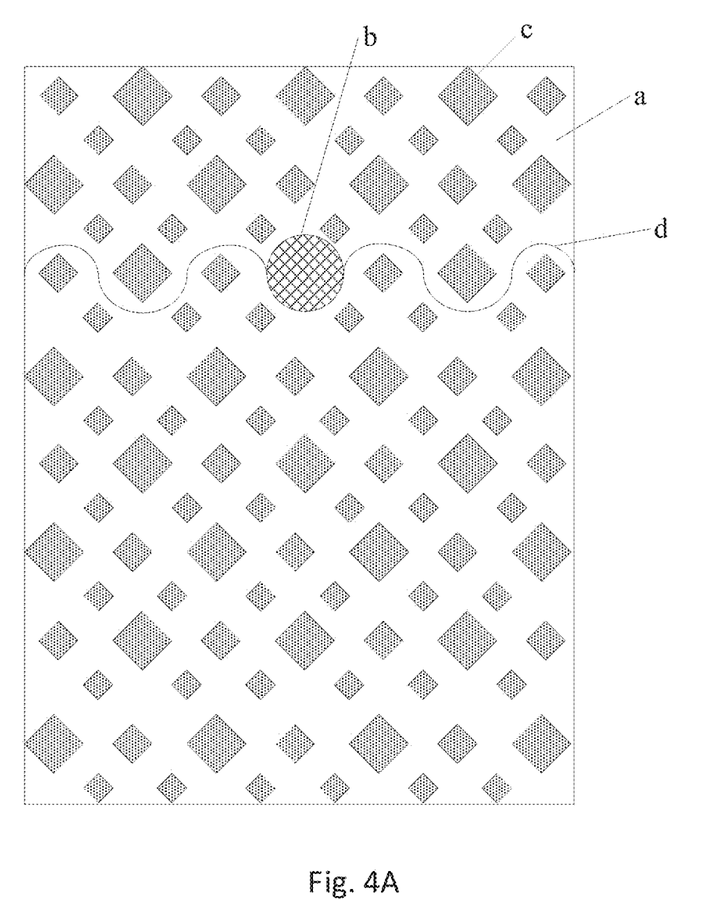
FIG. 4A and FIG. 4B are respectively schematic views of display areas corresponding to opening areas in a mask module according to an arrangement of the present disclosure.
Figure 4B:
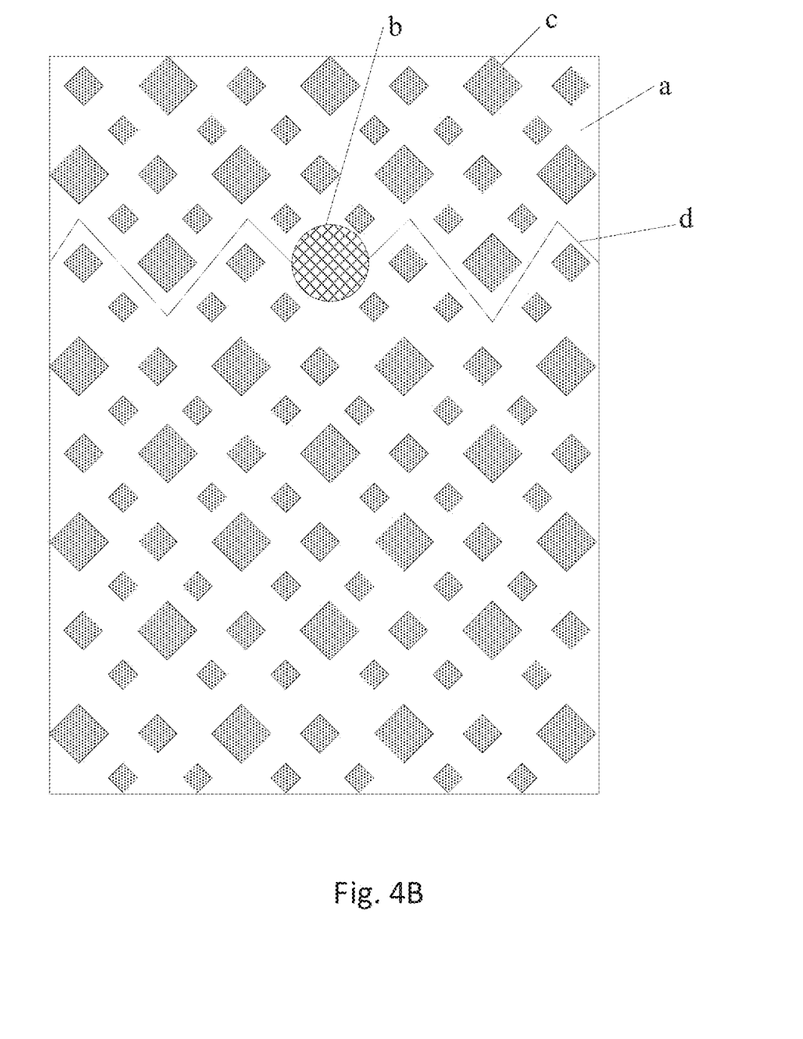

According to the first method, in the specific implementation, in the aforementioned mask module according to the arrangement of the present disclosure, as shown in FIG. 4A and FIG. 4B, the stitching edge d between the opening areas 101 and 201 of the open type masks 100 and 200 corresponding to the same joint a may be correspondingly provided at a gap between pixel light-emitting areas c in the joint a, so that non-uniform film layer formed at the stitching edge d may not affect normal light-emitting of the respective pixel light-emitting area c.

Particularly, in the aforementioned mask module according to the arrangement of the present disclosure, according to a manner of arranging the pixel light-emitting areas c, the stitching edge d between the opening areas 101 and 201 of the open type masks 100 and 200 corresponding to the same joint a may be a curve as shown in FIG. 4A, or a polyline as shown in FIG. 4B, or may be a straight line, which is not limited herein.

Figure 5:
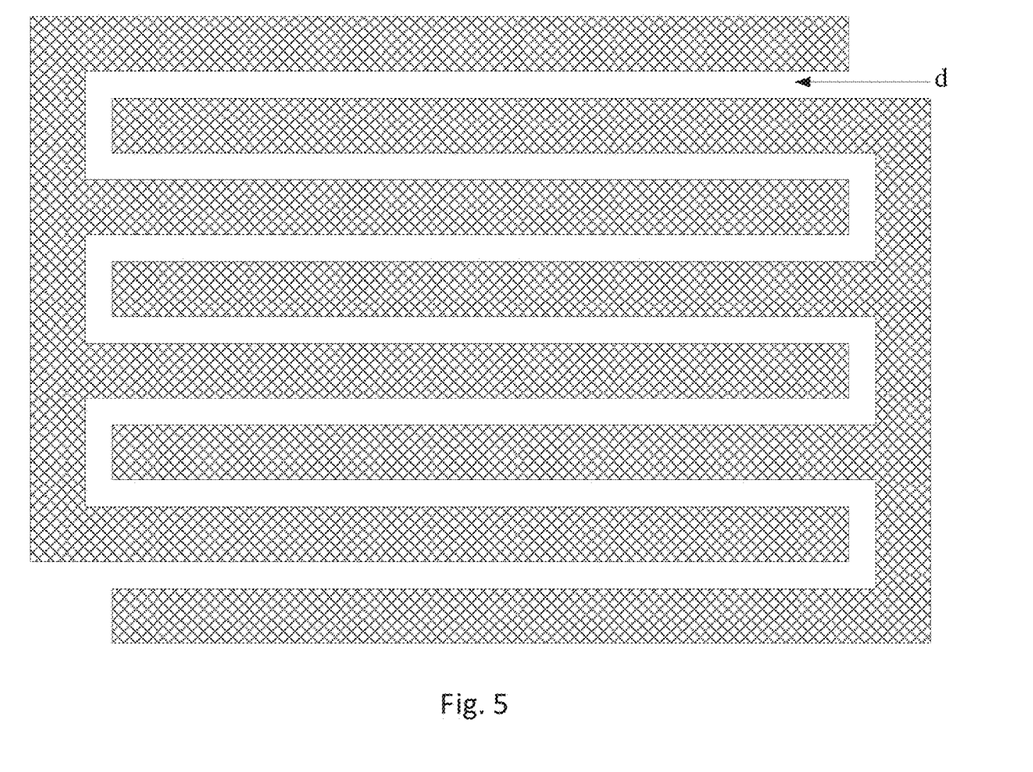
FIG. 5 is a schematic partial structural view of a mask module according to an arrangement of the present disclosure.

According to the second method, in the specific implementation, in the aforementioned mask module according to the arrangement of the present disclosure, as shown in FIG. 5, the stitching edge d between the opening areas 101 and 201 of the open type masks 100 and 200 corresponding to the same joint a has a grating complementary structure, which may play a function similar to grating diffraction for the light transmitted through the mask, to make the film thickness at the stitching edge d more uniform.

Particularly, in the aforementioned mask module according to the arrangement of the present disclosure, as shown in FIG. 5, the stitching edge d between the opening areas 101 and 201 of the open type masks 100 and 200 corresponding to the same joint a may have a stripe structure, so that the stripe structure at the stitching edge d between the opening areas 101 and 201 of the open type masks 100 and 200 may take a function similar to grating diffraction for the light transmitted through the mask, and the strip structure between the two stitching edges d may constitute a finger-cross structure to ensure that the opening areas 101 and 201 constitute a complementary pattern.

Figure 6:
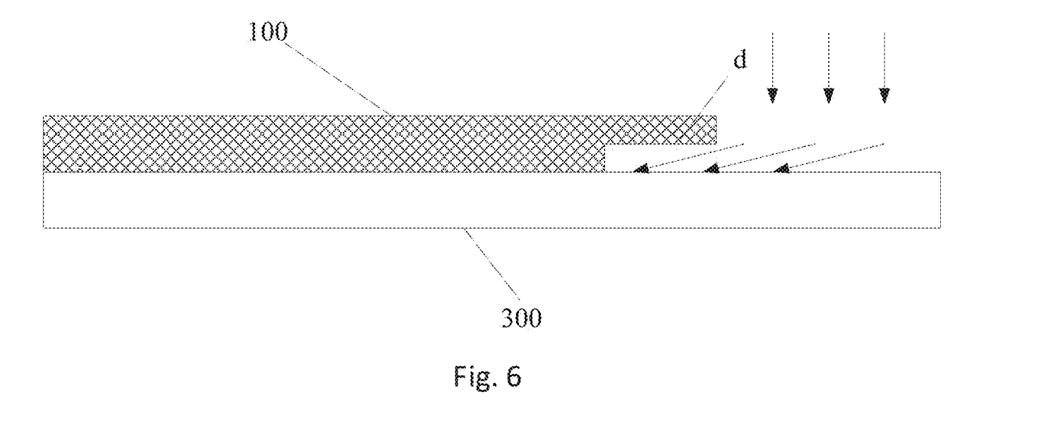
FIG. 6 is a schematic view of a mask of one mask in the mask module according to an arrangement of the present disclosure.

According to the third method, in the specific implementation, in the aforementioned mask module according to the arrangement of the present disclosure, as shown in FIG. 6, the stitching edge d between the opening areas 101 and 201 of the open type masks 100 and 200 corresponding to the same joint a may have a semi-evaporation structure, such that a gap is formed between the open type masks 100 and 200 and the display substrate 300 to be evaporated. A part of the evaporated materials may be deposited along the gap under the semi-evaporation structure, so that the film thickness at the edge d of the joint is transitioned more uniformly.

Particularly, in the aforementioned mask module according to the arrangement of the present disclosure, there are many specific manners of forming the semi-evaporation structure of the stitching edge d, for example, as shown in FIG. 6, a thickness of the mask 10 at the stitching edge d between the opening areas 101 and 201 of the open type masks 100 and 200 corresponding to the same joint a is smaller than the thickness at other areas, and the thickness of the side at the stitching edge d facing the substrate 300 to be evaporated is reduced, so that a gap is formed between the open type mask 100 and 200 and the display substrate 300 to be evaporated, and a part of the evaporated materials may be deposited along the gap under the semi-evaporation structure.

Particularly, in the aforementioned mask module according to the arrangement of the present disclosure, the ratio of thickness decreased at the stitching edge d area may be 20%-50%, and may be adjusted according to specific conditions and processes, in order to ensure that the film thickness at the stitching edge is transitioned uniformly.

Based on the same concept disclosed, an arrangement of the present disclosure further provides a method for manufacturing a film layer, which is implemented in the following manners:

Each open type mask in the aforementioned mask module according to the arrangement of the present disclosure is used as a blocking pattern, to perform evaporation of the same material to the same motherboard, such that an evaporation film layer having an island pattern is formed at the display area in the motherboard corresponding to the display substrate, and thus the manufactured pattern of the blocking film layer is not affected by the connecting structure. Therefore, an organic light-emitting display panel including at least one non-displayed island pattern may be manufactured according to requirements.

In specific implementation, in the above manufacturing method according to the arrangement of the present disclosure, the evaporation film layer may be organic light-emitting functional film layer such as a white light-emitting layer, a hole transporting layer, an electron transporting layer, and the like, and may also be a cathode layer, or a thin film encapsulation functional layer, which is not limited herein.

Based on the same concept disclosed, an arrangement of the present disclosure further provides a method for manufacturing an organic electroluminescent display panel, including the method for manufacturing the aforementioned film layer according to the arrangement of the present disclosure. Each open type mask in the aforementioned mask module according to the arrangement of the present disclosure is used as a blocking pattern, to perform evaporation of the same material to the same motherboard, such that an evaporation film layer having an island pattern is formed at the display area in the motherboard corresponding to the display substrate, and thus the manufactured pattern of the blocking film layer is not affected by the connecting structure. Therefore, an organic light-emitting display panel including at least one non-displayed island pattern may be manufactured according to requirements.

Based on the same concept disclosed, an arrangement of the present disclosure further provides an organic electroluminescent display panel manufactured by using the method for manufacturing the organic electroluminescent display panel as above described, in which film layers are formed in a display area, and each of the film layers has cutout areas mutually overlapped to one another to form an island pattern in the display area.

Particularly, the island pattern of the organic electroluminescent display panel manufactured by using the abovementioned manufacturing method does not have any film layer pattern, as a result, a camera or an earpiece may be provided at the island pattern, that is, some functional means currently arranged at the frame of a display device are provided in the display area, such that a display device with a narrow frame or frameless may be designed. Alternatively, the island pattern is set as an identifying pattern to realize the irregular display as desired.

The mask module, the organic electroluminescent display panel and manufacturing method thereof as provided in arrangements of the present disclosure substitute a plurality of open type masks for the existing one open type mask to manufacture a film layer having an island pattern in the display area, and the opening areas of the open type mask are not overlapped with each other and are stitched to form a pattern of the display area having the island pattern, which ensures that the opening areas of the open type mask do not contain the blocking pattern connected to the edge through the connecting structure. Each open type mask in the aforementioned mask module according to the arrangement of the present disclosure is used as a blocking pattern, to perform evaporation of the same material to the same motherboard, such that an evaporation film layer having an island pattern is formed at the display area in the motherboard corresponding to the display substrate, and thus the manufactured pattern of the blocking film layer is not affected by the connecting structure. Therefore, an organic light-emitting display panel including at least one non-displayed island pattern may be manufactured according to requirements.

The foregoing descriptions are merely specific implementations of the present disclosure, but the protection scope of the present disclosure is not limited thereto, and any person skilled in the art would easily think of variations or alterations within the scope disclosed by the present disclosure. Therefore, the protection scope of the present disclosure should be determined in view of the protection scope of the claims.

What is claimed is:

1. A mask module used for manufacturing a display substrate, the display substrate has at least one display area, the at least one display area has at least one island pattern, the mask module comprises:
   at least two open type masks, each of the open type masks has an opening area corresponding to the at least one display area, wherein
   the opening areas of the open type masks corresponding to a same display area of the at least one display area are not overlapped with each other, and
   the open type masks are stitched to constitute a joint and a blocking structure, the joint has a same shape as a shape of the display area, and the blocking structure has a same shape as a shape of the at least one island pattern,
   wherein a stitching edge between opening areas of the open type masks corresponding to the same display area has a semi-evaporation structure,
   wherein a thickness of the mask at a stitching edge area between opening areas of the open type masks corresponding to the same display area is smaller than a thickness at other areas, and the a thickness at one side of the stitching edge area facing to the display panel to be evaporated is decreased.

2. The mask module according to claim 1, wherein the opening areas of the open type masks corresponding to the same display area constitute a complementary pattern.

3. The mask module according to claim 1, wherein a stitching edge between the opening areas of the open type masks corresponding to the same display area corresponds to a gap between pixel light-emitting areas in the display area.

4. The mask module according to claim 1, wherein a stitching edge between opening areas of the open type masks corresponding to the same display area is a curve or a polyline.

5. The mask module according to claim 1, wherein a stitching edge between the opening areas of the open type masks corresponding to the same display area have a grating complementary structure.

6. The mask module according to claim 5, wherein the stitching edge between opening areas of the open type masks corresponding to the same display area has a strip structure, and the strip structure between two stitching edges constitutes a finger-cross structure.

7. The mask module according to claim 1, wherein a ratio of the thickness at the stitching edge area is decreased by 20%-50%.

8. The mask module according to claim 1, wherein a number of the open type masks is two.

9. A method of manufacturing a film layer, comprising:
   using open type masks in a mask module as a blocking pattern sequentially to perform evaporation of same materials to a same motherboard, such that an evaporation film layer having an island pattern is formed at a display area of a motherboard corresponding to each display substrate, wherein the mask module comprises:
   at least two open type masks, each of the open type masks has an opening area corresponding to the at least one display area, wherein the opening areas of the open type masks corresponding to a same display area of the at least one display area are not overlapped with each other, and
   the open type masks are stitched to constitute a joint and a blocking structure, the joint has a same shape as a shape of the display area, and the blocking structure has a same shape as a shape of the at least one island pattern,
   wherein a stitching edge between opening areas of the open type masks corresponding to the same display area has a semi-evaporation structure,
   wherein a thickness of the mask at a stitching edge area between opening areas of the open type masks corresponding to the same display area is smaller than a thickness at other areas, and the a thickness at one side of the stitching edge area facing to the display panel to be evaporated is decreased.

10. The manufacturing method according to claim 9, wherein the evaporation film layer is an organic light-emitting functional film layer, a cathode layer, or a thin film encapsulation functional layer.

11. A method of manufacturing an organic electroluminescent display panel, comprising:
  manufacturing a film layer, wherein manufacturing the film layer comprises:
  using open type masks in a mask module as a blocking pattern sequentially to perform evaporation materials to a same motherboard, wherein an evaporation film layer having an island pattern is formed at a display area of the motherboard corresponding to display substrate, wherein the mask module comprises:
    at least two open type masks, each of the open type masks has an opening area corresponding to the at least one display area, wherein the opening areas of the open type masks corresponding to a same display area of the at least one display area are not overlapped with each other, and
    the open type masks are stitched to constitute a joint and a blocking structure, the joint has a same shape as a shape of the display area, and the blocking structure has a same shape as a shape of the at least one island pattern,
  wherein a stitching edge between opening areas of the open type masks corresponding to the same display area has a semi-evaporation structure,
  wherein a thickness of the mask at a stitching edge area between opening areas of the open type masks corresponding to the same display area is smaller than a thickness at other areas, and the a thickness at one side of the stitching edge area facing to the display panel to be evaporated is decreased.

12. An organic electroluminescent display panel manufactured by the method according to claim 11, comprising:
  film layers formed in a display area, each of the film layers having a cutout area overlapped with each other to form an island pattern in the display area.

13. The organic electroluminescent display panel according to claim 12, wherein a camera or an earpiece is disposed at the island pattern; or the island pattern is a set identification image.

* * * * *